US011665851B2

(12) United States Patent
Cho et al.

(10) Patent No.: US 11,665,851 B2
(45) Date of Patent: May 30, 2023

(54) DYNAMIC AIRFLOW IMPEDANCE BLANK FOR AN INFORMATION HANDLING RESOURCE

(71) Applicant: Dell Products L.P., Round Rock, TX (US)

(72) Inventors: Shih-Huai Cho, New Taipei (TW); Tsung-Ping Chen, Taipei (TW)

(73) Assignee: Dell Products L.P., Round Rock, TX (US)

( * ) Notice: Subject to any disclaimer, the term of this patent is extended or adjusted under 35 U.S.C. 154(b) by 291 days.

(21) Appl. No.: 16/725,388

(22) Filed: Dec. 23, 2019

(65) Prior Publication Data

US 2021/0195790 A1 Jun. 24, 2021

(51) Int. Cl.
*H02K 1/17* (2006.01)
*H05K 7/20* (2006.01)
*H02K 1/18* (2006.01)

(52) U.S. Cl.
CPC .......... *H05K 7/20172* (2013.01); *H02K 1/17* (2013.01); *H02K 1/18* (2013.01); *H05K 7/2019* (2013.01); *H05K 7/20718* (2013.01)

(58) Field of Classification Search
CPC ............. H05K 7/20172; H05K 7/2019; H05K 7/20718; H02K 1/17; H02K 1/18
See application file for complete search history.

(56) References Cited

U.S. PATENT DOCUMENTS

| 7,646,601 | B2 * | 1/2010 | Zhang | G06F 1/20 361/695 |
| 8,740,560 | B2 * | 6/2014 | Gong | H05K 7/20172 415/214.1 |
| 2005/0184605 | A1 * | 8/2005 | Vinson | F04D 25/0646 310/68 R |
| 2006/0039108 | A1 * | 2/2006 | Chikusa | G11B 33/128 361/695 |
| 2006/0227505 | A1 * | 10/2006 | Miyamoto | H05K 7/20572 361/695 |
| 2009/0016019 | A1 * | 1/2009 | Bandholz | G06F 1/20 361/695 |
| 2015/0330397 | A1 * | 11/2015 | Alshinnawi | F04D 27/001 700/282 |
| 2017/0325363 | A1 * | 11/2017 | Tsai | H05K 7/20 |

* cited by examiner

*Primary Examiner* — Rina I Duda
(74) *Attorney, Agent, or Firm* — Jackson Walker L.L.P.

(57) ABSTRACT

An information handling resource blank configured to populate a slot of an information handling system in lieu of an information handling resource may include a form factor having at least some features in common with that of the information handling resource and one or more false fans mechanically coupled to the form factor. Each of the one or more false fans may be configured to have a first airflow impedance when airflow through such false fan is below a threshold airflow and have a second airflow impedance when airflow through such false fan is above the threshold airflow.

14 Claims, 3 Drawing Sheets

DYNAMIC AIRFLOW IMPEDANCE BLANK FOR AN INFORMATION HANDLING RESOURCE

TECHNICAL FIELD

The present disclosure relates to modular information handling systems. More specifically, embodiments of the disclosure define a dynamic airflow impedance blank for an information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM), hard disk drives, and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Oftentimes, an information handling system chassis may be configured to receive a plurality of modular information handling resources, such as hard disk drives, in a corresponding plurality of externally-facing slots. In such a chassis, a blank may sometimes be used to populate a slot not otherwise populated with an information handling resource in order to provide airflow impedance for the slot similar to an airflow impedance of an information handling resource populating the slot, in order to provide for desirable operating of an air mover-based cooling system.

In some instances, when an information handling system workload (e.g., processing resources and high-power components) is low, cooling required by modular information handling resources received within externally facing slots may be the main driver of air mover speed in a chassis, and such airflow requirement may be low. In such a scenario, presence of a blank for a slot not populated by an information handling resource may be desirable to prevent airflow bypass and maintain airflow pattern balance. However, when the information handling system workflow is heavy, processing resources and other high-power components may instead be the main driver of air mover speed, requiring significantly higher airflow. In such a scenario, a blank may not be desirable, in order to enable a maximum level of airflow.

SUMMARY

In accordance with the teachings of the present disclosure, the disadvantages and problems associated with traditional approaches to controlling airflow in a chassis with information handling resource blanks have been substantially reduced or eliminated.

In accordance with embodiments of the present disclosure, an information handling resource blank configured to populate a slot of an information handling system in lieu of an information handling resource may include a form factor having at least some features in common with that of the information handling resource and one or more false fans mechanically coupled to the form factor. Each of the one or more false fans may be configured to have a first airflow impedance when airflow through such false fan is below a threshold airflow and have a second airflow impedance when airflow through such false fan is above the threshold airflow.

In accordance with embodiments of the present disclosure, a false fan may include a stator having a first magnet coupled thereto a rotor having a second magnet coupled thereto and configured to rotate relative to the stator about an axis generally parallel to a direction of airflow through the false fan, wherein the first magnet and the second magnet are configured to maintain the rotor and the stator in a fixed position relative to one another via a magnetic force between the first magnet and the second magnet in absence of another force greater than the magnetic force.

In accordance with embodiments of the present disclosure, a method may include providing a form factor having at least some features in common with that of an information handling resource configured to populate a slot of an information handling system and mechanically coupling one or more false fans to the form factor, each of the one or more false fans configured to have a first airflow impedance when airflow through such false fan is below a threshold airflow and have a second airflow impedance when airflow through such false fan is above the threshold airflow.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
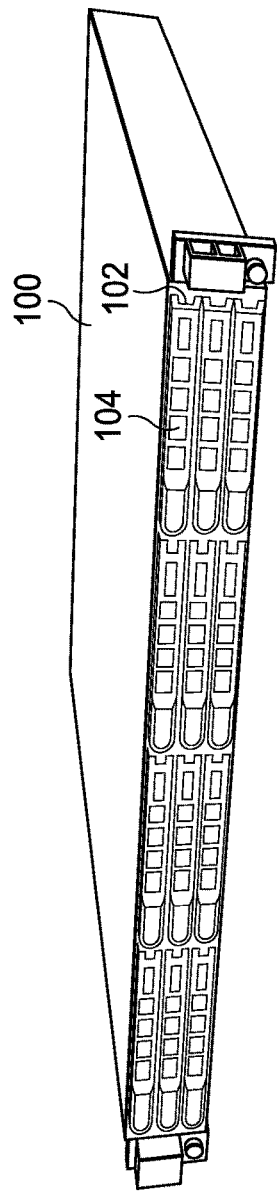
FIG. 1 illustrates a perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more externally-facing slots 102 each configured to receive a corresponding information handling resource 104. In some embodiments, each information handling resource 104 may comprise a hard disk drive.

Figure 2:
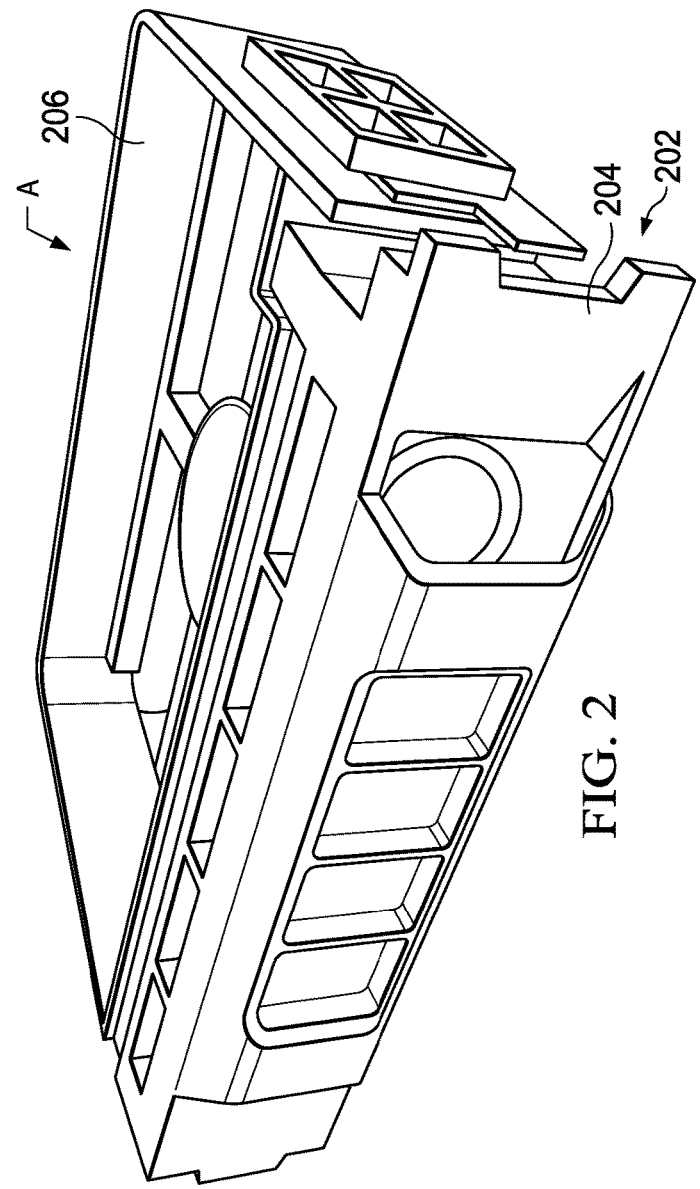
FIG. 2 illustrates a perspective view of an example information handling resource blank, in accordance with embodiments of the present disclosure.

FIG. 2 illustrates a perspective view of an example information handling resource blank 202, in accordance with embodiments of the present disclosure. In some instances, should any of slots 102 not be populated with a corresponding information handling resource 104, such slot 102 may be instead populated with an information handling resource blank 202 which may have some form factor features in common with information handling resource 104. As shown in FIG. 2, information handling resource blank 202 may include a front portion 204 that may face externally to chassis 100 when information handling resource blank 202 is populated in a slot 102 and a back portion 206 that may reside within chassis 100 when information handling resource blank 202 is populated in a slot 102.

Figure 3:
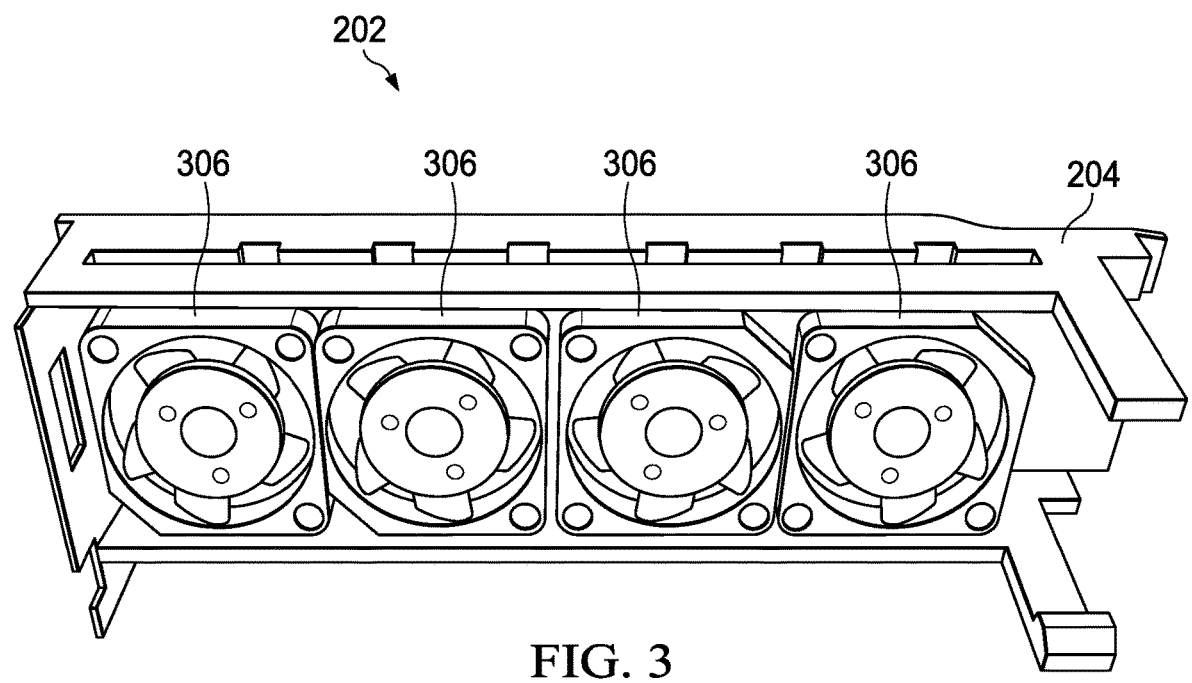
FIG. 3 illustrates a rear elevation view of a front portion of an example information handling resource blank, in accordance with embodiments of the present disclosure.

FIG. 3 illustrates a rear elevation view of front portion 204 of information handling resource blank 202, in accordance with embodiments of the present disclosure. The view of FIG. 3 may be in the direction of "A" shown in FIG. 2. As shown in FIG. 3, information handling resource blank 202 may have coupled thereto one or more false fans 306.

Figure 4:
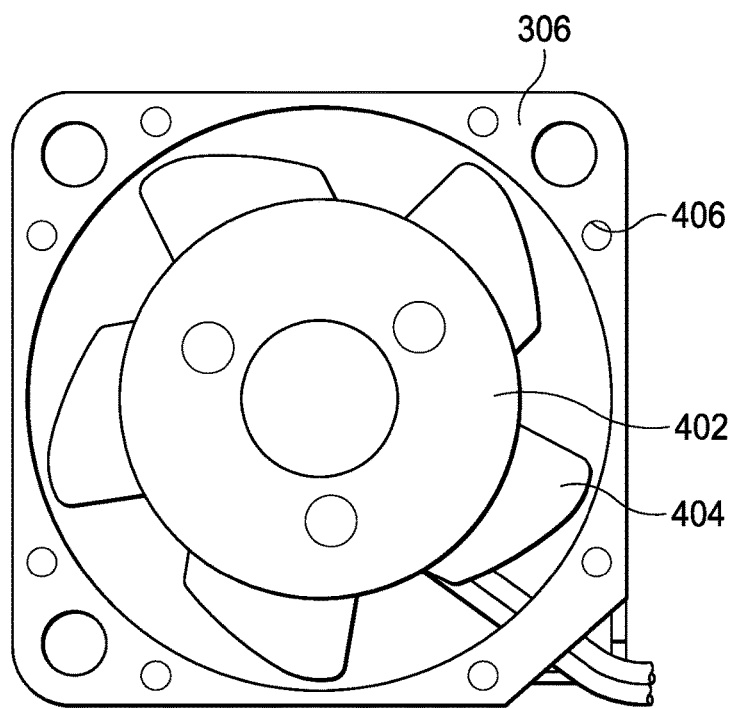
FIG. 4 illustrates an elevation view of a false fan for use in an information handling resource blank, in accordance with embodiments of the present disclosure.

FIG. 4 illustrates an elevation view of a false fan 306 for use in information handling resource blank 202, in accordance with embodiments of the present disclosure. As shown in FIG. 4, false fan 306 may include a rotor 402 configured to rotate relative to a stator 406. When installed within information handling resource blank 202, each false fan 306 may be oriented such that when information handling resource blank 202 is disposed in a slot 102 of chassis 100, rotor 402 rotates about an axis substantially parallel to a direction of airflow driven by air movers (not shown) of chassis 100. As shown in FIG. 4, each rotor 402 may have a plurality of blades 404.

Figure 5:
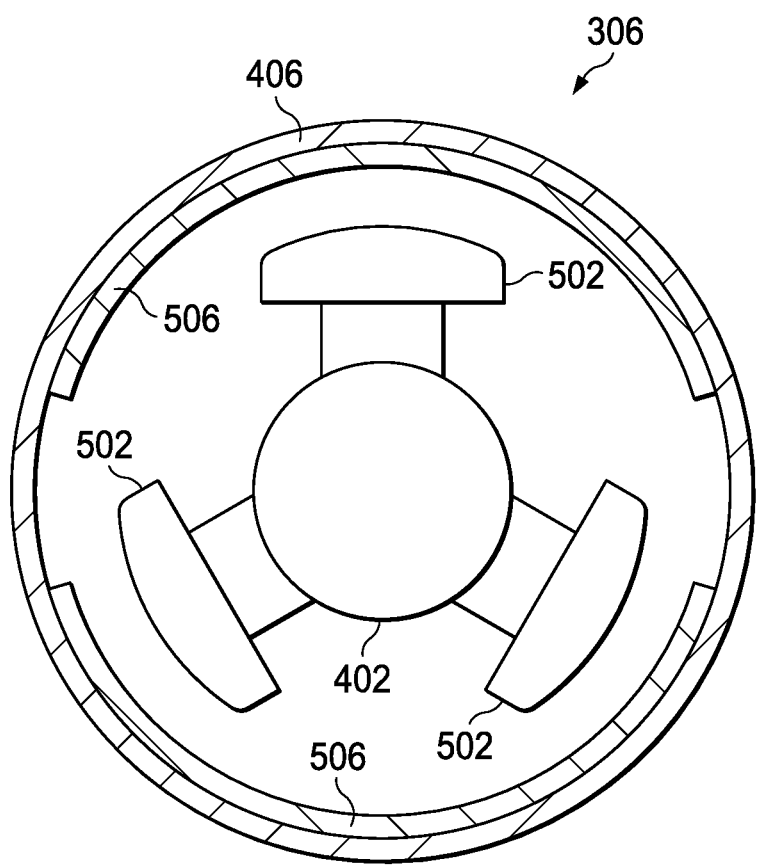
FIG. 5 illustrates an elevation view of particular components of a false fan for use in an information handling resource blank, in accordance with embodiments of the present disclosure.

FIG. 5 illustrates an elevation view of particular components of false fan 306 for use in information handling resource blank 202, in accordance with embodiments of the present disclosure. Notably, in FIG. 5, blades 404 have been removed for purposes of clarity and exposition. As shown in FIG. 5, rotor 402 may include one or more permanent magnets 502 and stator 406 may have one or more permanent magnets 506. Magnetic polarities of permanent magnets 502 and permanent magnets 506 may be configured and oriented such that magnetic force maintains rotor 402 and stator 406 in a fixed position relative to one another in the absence of another force that overcomes such magnetic force.

Thus, in operation, when airflow driven through a false fan 306 is below a threshold airflow (e.g., such that the force of such airflow on blades 404 is less than that of the magnetic force between permanent magnets 502 and permanent magnets 506), rotor 402 and stator 406 may remain in a fixed position relative to one another, and false fan 306 may provide a first airflow impedance when rotor 402 and stator 406 remain in a fixed position relative to one another (e.g., blades 404 provide airflow resistance and airflow is through gaps between blades 404).

However, when airflow driven through a false fan 306 is above the threshold airflow (e.g., such that the force of such airflow on blades 404 is greater than that of the magnetic force between permanent magnets 502 and permanent magnets 506), rotor 402 may rotate relative to stator 406, and false fan 306 may provide a second airflow impedance smaller than the first airflow impedance when rotor 402 rotates relative to stator 406.

Accordingly, information handling resource blank 202 comprising one or more false fans 306 may have a dynamic airflow impedance dependent upon an airflow driven by air movers of chassis 100.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling resource blank configured to populate a slot of an information handling system in lieu of an information handling resource, the information handling resource blank comprising:
   a form factor having at least some features in common with that of the information handling resource; and
   one or more fans mechanically coupled to the form factor, each of the one or more fans configured to:
      have a first airflow impedance responsive to airflow through such fan being below a threshold airflow; and
      have a second airflow impedance responsive to airflow through such fan being above the threshold airflow.

2. The information handling resource blank of claim 1, wherein each of the one or more fans comprises:
   a stator having a first magnet coupled thereto; and
   a rotor having a second magnet coupled thereto and configured to rotate relative to the stator about an axis generally parallel to a direction of airflow through the fan;
   wherein the first magnet and the second magnet are configured to maintain the rotor and the stator in a fixed position relative to one another via a magnetic force between the first magnet and the second magnet in absence of another force greater than the magnetic force.

3. The information handling resource blank of claim 2, wherein:
   the magnetic force maintains the rotor and the stator in a fixed position relative to one another when airflow through such fan is below the threshold airflow; and
   the rotor rotates relative to the stator when airflow through such fan is above the threshold airflow.

4. The information handling resource blank of claim 3, wherein the rotor has a plurality of blades such that airflow upon the blades above the threshold airflow causes the rotor to rotate relative to the stator.

5. The information handling resource blank of claim 2, wherein the first magnet and the second magnet are permanent magnets.

6. The information handling resource blank of claim 1, wherein the information handling resource is a hard disk drive.

7. A fan comprising:
   a stator having a first magnet coupled thereto; and
   a rotor having a second magnet coupled thereto and configured to rotate relative to the stator about an axis generally parallel to a direction of airflow through the fan;
   wherein the first magnet and the second magnet are configured to maintain the rotor and the stator in a fixed position relative to one another via a magnetic force between the first magnet and the second magnet in absence of another force greater than the magnetic force such that:
      the magnetic force maintains the rotor and stator in a fixed position relative to one another in response to airflow through the fan being below a threshold airflow; and
      the rotor rotates relative to the stator in response to airflow through the fan being above the threshold airflow.

8. The fan of claim 7, wherein the rotor has a plurality of blades such that airflow upon the blades above the threshold airflow causes the rotor to rotate relative to the stator.

9. The fan of claim 7, wherein the first magnet and the second magnet are permanent magnets.

10. A method comprising:

providing a form factor having at least some features in common with that of an information handling resource configured to populate a slot of an information handling system; and mechanically coupling one or more fans to the form factor, each of the one or more fans configured to:

have a first airflow impedance responsive to airflow through such fan being below a threshold airflow; and have a second airflow impedance responsive to airflow through such fan being above the threshold airflow.

11. The method of claim 10, wherein:

each of the one or more fans comprises:

a stator having a first magnet coupled thereto; and a rotor having a second magnet coupled thereto and configured to rotate relative to the stator about an axis generally parallel to a direction of airflow through the fan; and the method further comprises configuring the first magnet and the second magnet to maintain the rotor and the stator in a fixed position relative to one another via a magnetic force between the first magnet and the second magnet in absence of another force greater than the magnetic force.

12. The method of claim 11, wherein:

the magnetic force maintains the rotor and the stator in a fixed position relative to one another when airflow through such fan is below the threshold airflow; and the rotor rotates relative to the stator when airflow through such fan is above the threshold airflow.

13. The method of claim 12, wherein the rotor has a plurality of blades such that airflow upon the blades above the threshold airflow causes the rotor to rotate relative to the stator.

14. The method of claim 11, wherein the first magnet and the second magnet are permanent magnets.

* * * * *